United States Patent
Trochut et al.

(10) Patent No.: US 9,461,641 B2
(45) Date of Patent: Oct. 4, 2016

(54) METHOD AND DEVICE FOR MANAGEMENT OF AN ELECTRICAL POWER-UP OF A SECTOR OF AN ELECTRONIC CIRCUIT

(71) Applicant: STMicroelectronics SA, Montrouge (FR)

(72) Inventors: Severin Trochut, Gilly sur Isere (FR); Emilie Rigal, Crolles (FR); Fabrice Blisson, Grenoble (FR); Frederic Hasbani, Hurtieres (FR); Nicolas Seller, Polienas (FR)

(73) Assignee: STMicroelectronics SA, Montrouge (FR)

( * ) Notice: Subject to any disclaimer, the term of this patent is extended or adjusted under 35 U.S.C. 154(b) by 495 days.

(21) Appl. No.: 14/062,455

(22) Filed: Oct. 24, 2013

(65) Prior Publication Data

US 2014/0167527 A1 Jun. 19, 2014

(30) Foreign Application Priority Data

Dec. 14, 2012 (FR) ...................................... 12 62039

(51) Int. Cl.
*H03K 17/687* (2006.01)
*H03K 17/22* (2006.01)
*G06F 1/32* (2006.01)

(52) U.S. Cl.
CPC .......... *H03K 17/6871* (2013.01); *H03K 17/22* (2013.01); *G06F 1/3287* (2013.01); *Y02B 60/1282* (2013.01); *Y10T 307/76* (2015.04)

(58) Field of Classification Search
None
See application file for complete search history.

(56) References Cited

U.S. PATENT DOCUMENTS

| 7,443,759 | B1* | 10/2008 | Rowlands | G11C 7/20 365/226 |
|---|---|---|---|---|
| 7,663,961 | B1* | 2/2010 | Rowlands | G11C 7/20 365/226 |
| 7,671,623 | B2 | 3/2010 | Blisson | |
| 2010/0123515 | A1 | 5/2010 | Sasaki et al. | |

OTHER PUBLICATIONS

Royannez, P et al., "90nm Low Leakage SoC Design Techniques for Wireless Applications," ISSCC 2005, Session 7, Multimedia Processing 7.6, Texas Instruments, Villeneauve Loubet, France, Jan. 1, 2005, 4 pages.

* cited by examiner

*Primary Examiner* — Carlos Amaya
*Assistant Examiner* — Aqeel Bukhari
(74) *Attorney, Agent, or Firm* — Slater Matsil, LLP

(57) ABSTRACT

A chain of switches is connected between a first power supply line coupled to a first voltage and a second power supply line coupled to the sector. These switches are controllable by a control signal. The control signal is propagated from a first end of the first chain towards a second end of the first chain without control of the switches during this first propagation. The control signal is then propagated in the reverse direction from the second end towards the first end with a control of the switches during this second propagation starting from a group of at least one switch situated at the second end. There is a detection of the arrival of the control signal at the first end of the chain at the end of its propagation in the reverse direction.

27 Claims, 12 Drawing Sheets

METHOD AND DEVICE FOR MANAGEMENT OF AN ELECTRICAL POWER-UP OF A SECTOR OF AN ELECTRONIC CIRCUIT

This application claims priority to France Patent Application 1262039, which was filed Dec. 14, 2012 and is incorporated herein by reference.

TECHNICAL FIELD

The invention relates to electronic circuits and, in particular embodiments, to the management of an electrical power-up of at least one sector of such an electronic circuit, for example, a "System-On-Chip," also known by those skilled in the art under the acronym SOC.

BACKGROUND

An electronic circuit of the SOC type is generally capable of executing various functions, for example, audio and/or video functions within a mobile telephone. Generally, all the functions that can be executed by the electronic circuit of the SOC type are not executed simultaneously.

A circuit of the SOC type comprises several sectors. A sector is consequently a part of the SOC circuit and may comprise one or more blocks of components.

A sector is capable of executing one or more functions and a function may be executed by one or more sectors. However, in general, a function is equivalent to a sector.

When a function is not currently being executed, it is particularly advantageous to isolate the power supply to the circuit, and the sector or sectors associated with this function, in order to reduce the leakage currents in the OFF state of the corresponding sector or sectors.

With this in mind, the power supply to a sector of such an electronic circuit is implemented by means of one or more chains of switches, for example PMOS transistors, connected to a power supply line designed to be connected to a power supply voltage VDDO for example. When the switches are closed, in other words when the transistors are conducting, the sector is electrically powered. On the other hand, when the switches are open, in other words when the transistors are turned off, the sector is isolated from the power supply line.

A control circuit, placed at the end of the chain, manages the control of the switches in such a manner as to isolate or apply a voltage to the sector in question.

When a sector is to be activated following an inactive phase, its electrical power-up requires the closure of all the switches associated with this sector. Then, when all the switches are closed, the control circuit generally generates a state signal indicating that the sector in question is correctly powered with the correct voltage. The sector can then begin to carry out its function.

At the present time, in order to cause the closing of all the switches, the control circuit delivers a control signal to the gate of the first switch of the chain and this control signal propagates along the chain so as to successively control all the switches of the chain. The control circuit then tests the level of the gate voltage of the first transistor forming the first switch, and when this voltage, which depends on the real gate voltage of all the transistors (switches), is lower (when the switches are PMOS transistors) than a given threshold, and the control circuit delivers the state signal.

However, when the size of a sector, and consequently the length of the switch chains designed to power this sector is very long, typically greater than 10 mm, the state signal is delivered while one or more switches situated at the end of the chain have still not switched from their open state to their closed state.

SUMMARY

According to one embodiment of the invention, a method and a device for management of the electrical power-up of at least one sector of an electronic circuit is accordingly provided, for example, for an electronic circuit of the SOC type, allowing, in an extremely simple manner and compatible with all geometrical forms of switch chains, a better guarantee that the state signal is delivered when all the switches have effectively switched into their closed state.

According to one aspect, a method for management of an electrical power-up of at least one sector of an electronic circuit is provided, for example for an electronic circuit of the SOC type. This electrical power-up uses at least a chain of switches respectively connected between a first power supply line coupled to a first voltage, for example a voltage VDDO of a few volts. A second power supply line is coupled to the sector. This second power supply line is designed, when the switches are conducting, to power the sector with a power supply voltage VDDI, close to or equal to the voltage VDDO.

The switches are controllable by a control signal so as to close them (i.e., make them conducting).

A method according to this aspect comprises a first propagation of the control signal from a first end of the first chain towards a second end of the first chain without control of the switches during this first propagation, and a second propagation of the control signal in the opposite direction from the second end towards the first end with a control of the switches during this second propagation starting from a group of at least one switch situated at the second end.

Thus, the control signal can, for example, be delivered between the last and the penultimate switches, the last switch being that situated at the second end, and in this case the control of the switches during the second propagation begins starting from that situated at the second end.

However, the control signal may also be delivered downstream (in the direction of the second propagation) of a group of switches, which group is situated at the second end, as long as the number of switches in the group is not too large. In other words, this embodiment can be used when the distance over which the switches of the group extend is not too large, typically less than or equal to a millimeter. In this case, the control of the switches during the second propagation begins starting from this group situated at the second end.

The method furthermore comprises a detection of the arrival of the control signal at the first end of the first chain at the end of its second propagation, and a delivery of a state signal in the presence of a delivery condition which comprises at least the detected arrival of the control signal.

When the chain only comprises a single branch, the second end of the chain, from where the return propagation of the control signal leaves in order to return to the first end, is the free end of the branch.

When the chain is branched, this second end is the end of the longest propagation path.

Thus, as far as a single branch or the longest path are concerned, the control signal is first of all propagated along the chain from the first switch as far as the last, without controlling the switches. Then, it is only during the reverse propagation, from the last switch towards the first, that the switches are controlled starting from the last. For this reason, the last switch to be controlled to switch into its closed state is that which is the closest to the location where the arrival of the control signal is detected. Consequently, the detection of this arrival of the control signal at the end of its second propagation in the reverse direction allows, when this arrival is detected, the state signal to be delivered with virtual certainty, or even total certainty, that all the switches of the chain have switched into their closed state (all the transistors have switched in their conducting state).

It will be seen hereinafter that, in the case of a branched chain, the switches situated along the shorter paths are also controlled during the corresponding reverse propagations of the control signal.

In order to further increase the reliability of the method, the level of the signal present at the control input of the switch situated at the first end of the first chain may furthermore be determined, in other words, for example to measure the gate voltage of the first switch of the chain and compare this level with a first threshold. The delivery condition for the state signal then comprises not only the detected arrival of the control signal, but also the exceeding of the first threshold by the level.

The level of the signal present on the second power supply line may also be determined and this level compared with a second threshold. In this case, the delivery condition furthermore comprises the exceeding of the second threshold by the level.

It is also possible, notably with large sectors, for the electrical power-up to use at least a second chain of switches respectively connected between the first power supply line and the second power supply line, that are also controllable by the control signal, the first end of the second chain being connected to the first end of the first chain.

In such an embodiment, the method then comprises a first propagation of the control signal also from the first end of the second chain towards a second end of the second chain without control of the switches of the second chain, and also a second propagation of the control signal in the reverse direction from the second end of the second chain towards the first end of the second chain with control of the switches of the second chain during the second propagation in the reverse direction starting from a group of at least one switch situated at the second end of the second chain.

The method then comprises a detection of the arrival of the control signal at the first end of the second chain at the end of its second propagation in the reverse direction.

Furthermore, the delivery condition also comprises the detected arrival of the control signal coming from the second chain.

In other words, in this embodiment, the state signal is only delivered when the arrival of the control signal at the end of its propagation in the reverse direction over each of the chains has been detected.

It is also possible, depending on the configuration of the sector, to use branched chains of switches with one or more branches that can penetrate into the interior of the sector.

Accordingly, when at least one of the chains of switches, for example the first, comprises an initial section of switches running from the first end of the chain and extended by several branches of switches, the initial section and the branches respectively define several paths connected at at least one intersection, the first propagation of the control signal ('outbound' direction) then comprises, according to one embodiment, a propagation of the control signal from the first end of the chain towards the free end of each branch, and, according to this embodiment, the second propagation of the control signal comprises for the longest path, a propagation of the control signal in the reverse direction from the free end of the corresponding branch towards the first end of the chain with a control of the switches situated on this longest path during the propagation in the reverse direction starting from a group of at least one switch situated at the free end of the branch, and for each of the other paths (in other words for the paths which are shorter) a propagation in the reverse direction of the control signal over a portion of the path running from the free end of the corresponding branch up to the intersection with the longest path or with another path, with control of the switches situated on the portion during the propagation in the reverse direction starting from a group of at least one switch situated at the free end of the branch, and interruption of the propagation in the reverse direction at the intersection.

In other words, in such an embodiment with a branched chain, the control signal is first of all propagated in the outbound direction along the branched chain until it reaches the ends of all the branches, without controlling the switches.

The longest path is then differentiated from the other paths.

For the longest path, the control signal will be propagated in the reverse direction from the end of the corresponding branch, in other words from the end of this longest path, towards the first end of the chain while controlling the switches starting from a group of at least one switch situated at the end of the longest path.

In contrast, for each of the other paths, the control signal will also be propagated in the reverse direction from the corresponding ends of these paths, but this propagation will be interrupted when an intersection is encountered with either the longest path or, potentially, another path, in order to avoid having conflicts of propagation in the reverse direction.

However, before interrupting these propagations in the reverse direction, the switches situated on the corresponding portions of path starting from a group of at least one switch situated at the end of the corresponding path are also controlled.

Accordingly, thus, when the arrival of the control signal at the end of its propagation in the reverse direction over the longest path has been detected, all the switches of the branched chain will have been controlled.

According to another aspect, a device for management of an electrical power-up of at least one sector of an electronic circuit is provided. At least a first chain of switches are respectively connected between a first power supply line intended to be coupled to a first voltage and a second power supply line intended to be coupled to the sector. These are controllable by a control signal so as to close them (conducting. A first propagation circuit is configured to propagate the control signal from a first end of the first chain towards a second end of the first chain without controlling the switches during this first propagation. A second propagation circuit is configured to propagate the control signal in the reverse direction from the second end towards the first end while controlling the switches during this propagation in the reverse direction, starting from a group of at least one switch situated at the second end. A processor is configured to detect the arrival of the control signal at the first end of the first chain at the end of the second propagation and to deliver a state signal in the presence of a delivery condition comprising the detected arrival of the control signal.

According to one embodiment, corresponding to a chain without branches, the device furthermore comprises a control line coupled to the respective control inputs of the switches. The first propagation circuit includes a controller configured to deliver the control signal and being coupled to the departure end of a first propagation line running from a first end of the chain towards the second end of the chain without electrical coupling with the control line. The second propagation circuit includes a second propagation line running from the second end of the chain towards the first end of the chain and is coupled to the control line at at least one location situated in the neighborhood of the second end of the chain (the distance between the location and the second end depending on the size of the group of switches being controlled. The second propagation circuit also includes an end electrical coupling circuit connecting the arrival end of the first propagation line to the departure end of the second propagation line. The processor is coupled to the arrival end of the second propagation line.

In practice, in the presence of long chains, the coupling between the reverse propagation line and the control line for the switches may be advantageously affected at several locations, in practice regularly spaced out every millimeter for example.

Furthermore, the coupling between a reverse propagation line and a control line for the switches is to be understood in the very broadest sense as being notably any coupling allowing the switches to be functionally controlled from the control signal transported over the reverse propagation line. This coupling can notably be achieved by means of a component, for example an inverter, connected between the two lines.

One embodiment can correspond to a branched chain. According to this embodiment, the chain comprises an initial section of switches running from the first end of the chain and extended by several branches of switches. The initial section and the branches respectively define several paths connected at at least one intersection. The first propagation circuit is configured to propagate the control signal from the first end of the chain towards the free end of each branch without controlling the switches during this first propagation. The second propagation circuit is configured, as regards the longest path, to propagate the control signal in the reverse direction from the free end of the corresponding branch towards the first end of the chain with a control of the switches situated on this longest path during the propagation in the reverse direction, starting from a group of at least one switch situated at the free end of the branch. As regards each of the other paths, the second propagation circuit is configured to propagate the control signal in the reverse direction over a portion of the path running from the free end of the corresponding branch up to the intersection with the longest path or with another path, with control of the switches situated on the portion during the propagation in the reverse direction starting from a group of at least one switch situated at the free end of the branch, and interruption of the propagation in the reverse direction at the intersection.

Here again, end coupling circuitry is advantageously disposed at the free ends of all the branches so as to ensure the continuity of the propagation of the control signal between the outbound and inbound directions.

Irrespective of the variant embodiment considered (branched chain or otherwise), the switches are for example incorporated into switching cells comprising various metallizations which, when they are electrically coupled, will form the various power supply lines, together with the control line of the switches and the propagation lines of the control signal in both directions.

In the case of a branched chain, a connection cell, for example in the shape of a T, is advantageously provided at each intersection, and, in order to fulfill the function of interruption of a reverse propagation of the control signal, interruption cells for example placed just upstream (in the direction of the reverse propagation) of the connection cells.

According to one embodiment, the processor is furthermore configured to determine the level of the signal present at the control input of the switch situated at the first end of the first chain and to compare this level with a first threshold. In addition, the delivery condition furthermore comprises the exceeding of the first threshold by the level.

According to one embodiment, the processor is furthermore configured to determine the level of the signal present on the second power supply line and in comparing this level with a second threshold, the delivery condition furthermore comprises the exceeding of the second threshold by the level.

According to one embodiment, the device furthermore comprises at least a second chain of switches respectively connected between the first power supply line and the second power supply line and controllable by the control signal. The first end of the second chain are connected to the first end of the first chain. The first propagation circuit is also configured to propagate the control signal from the first end of the second chain towards a second end of the second chain without control of the switches of the second chain during this propagation. The second propagation circuit is further configured to also propagate the control signal in the reverse direction from the second end of the second chain towards the first end of the second chain with control of the switches of the second chain during this propagation in the reverse direction starting from a group of at least one switch situated at the second end of the chain. The processor is further configured to detect the arrival of the control signal at the first end of the second chain at the end of its propagation in the reverse direction. The delivery condition then furthermore comprises the detected arrival of the control signal coming from the second chain.

BRIEF DESCRIPTION OF THE DRAWINGS

Other advantages and features of the invention will become apparent upon examining the detailed description of non-limiting embodiments and the appended drawings, in which.

DETAILED DESCRIPTION OF ILLUSTRATIVE EMBODIMENTS

Figure 1:
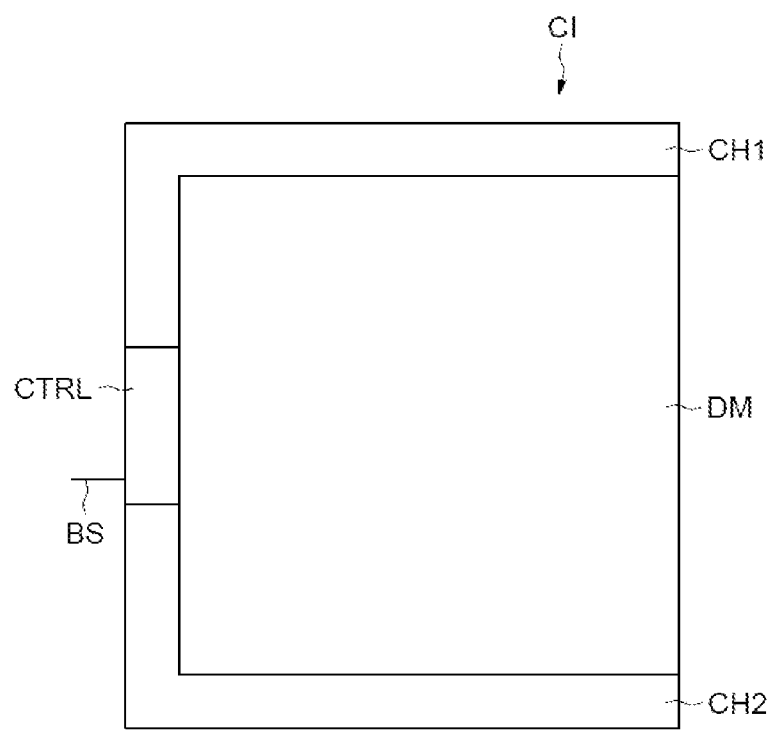
FIGS. 1 to 14 illustrate various embodiments of a method and of a device according to the invention.

In FIG. 1, the reference CI denotes an electronic circuit, for example a circuit of the SOC type. The reference DM denotes a sector of this circuit and this sector is powered in this example by two chains CH1, CH2 of switches controlled by a control circuit CTRL connected to a control bus BS.

Figure 2:
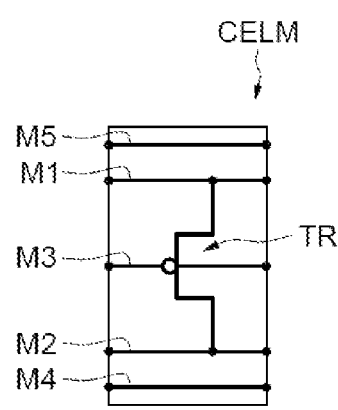

As illustrated in FIG. 2, here each switch is formed from a transistor TR, for example, a PMOS transistor incorporated within a cell CELM. The cell is referred to as a 'switching cell'.

The switching cell CELM comprises, aside from the transistor TR, a first metallization M1 and a second metallization M2 between which the switch (transistor) TR is connected. The cell also comprises a third metallization M3 connected to the control input of the switch, here the gate of the transistor TR. The cell also comprises a fourth metallization M4 and a fifth metallization M5. The function of these metallizations will be considered in more detail herein below.

Some of these various metallizations may be situated at the same metal level or else at different metal levels, with potentially, in this case, vias for connecting these metallizations for example to the terminals of the transistor.

Figure 3:
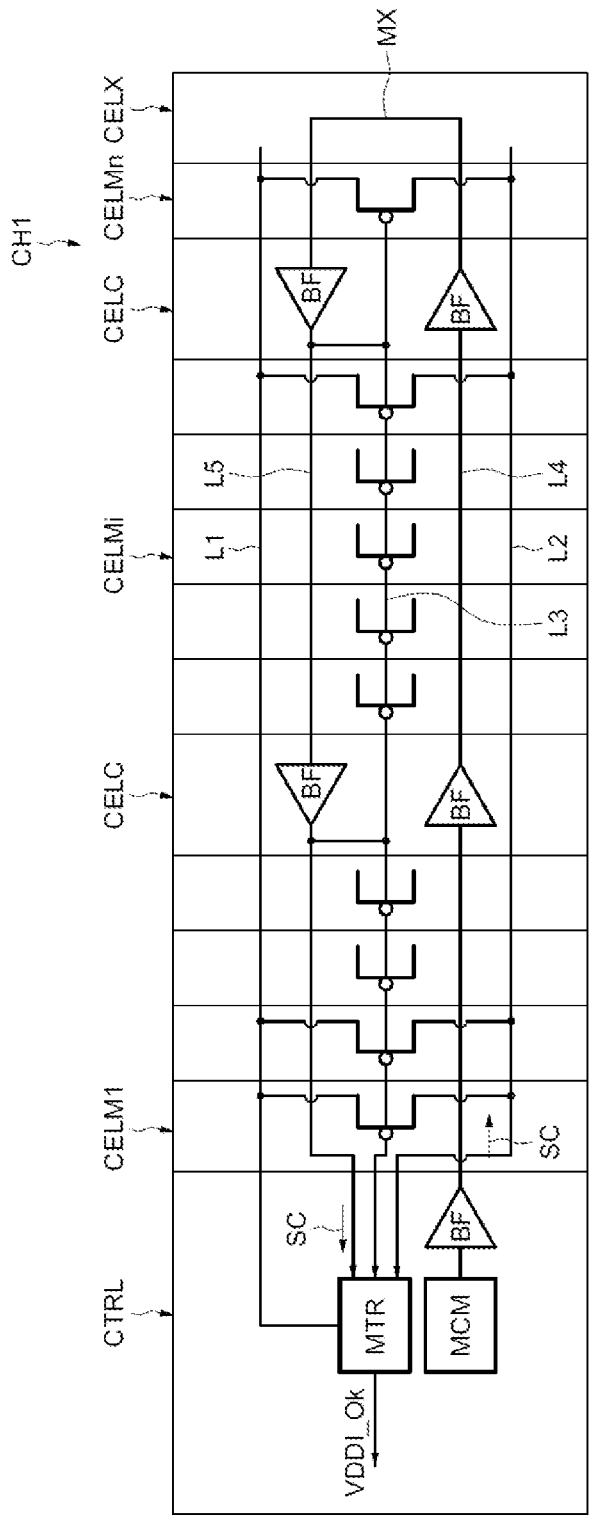

In FIG. 3, one exemplary embodiment of the chain CH1 is more particularly illustrated.

More precisely, the chain CH1 here comprises n switching cells CELM1-CELMn, some of which are joined together and others of which are separated by cells CELC. The sales CTLs the can be referred to as 'coupling cells', whose function will be considered in more detail herein below.

Furthermore, the control circuit CTRL is disposed at the first end of the chain CH1 whereas an end cell CELX is disposed at the second end of the chain CH1.

The first metallizations M1 of the switching cells are electrically coupled, either for example directly by contact with a switching cell to the neighboring cell, or by a metallization analogous to a coupling cell CELC, in order to form a first power supply line L1 intended to be coupled to the power supply voltage VDDO.

Similarly, the second metallizations M2 of the switching cells CELM are electrically coupled in a manner analogous to what has been described for the metallizations M1, in such a manner as to form a second power supply line coupled to the sector DM and designed, when the transistors TR are conducting, to have a voltage level VDDI.

The third metallizations M3 of the switching cells CELM are also electrically coupled in an analogous manner, so as to form a control line L3 for the transistors. This control line is connected to all the gates of these transistors.

The fourth metallizations M4 of the cells CELM are electrically coupled, also in a manner analogous to what has been described hereinabove, so as to form a first propagation line L4 for the control signal SC for the switches.

This first propagation line L4 is not electrically coupled to the control line L3 for the switches.

Lastly, the fifth metallizations M5 of the switching cells CELM are electrically coupled, in a manner analogous to what has been described hereinabove, so as to form a second propagation line for the control signal SC.

In contrast, this second propagation line L5 is electrically coupled to the control line L3 for the switches notably by metallizations and/or of vias formed within the coupling cells CELC.

Although this coupling between the lines L3 and L5 has been represented schematically by one line in order to illustrate the very general nature of this functional coupling, this coupling may be formed in practice by means of a suitable component, for example, an inverter or else a buffer stage, also known by those skilled in the art as simply a 'buffer.' The invention is not limited to these examples.

In the example described here, a coupling cell CELC is disposed between the penultimate and the last switching cell CELMn of the chain.

However, it would also be possible to insert the coupling cell CELC between a first group of switching cells running from the end cell, and another group of switching cells situated downstream of the first group, as long as the length of the first group is not too long, typically less than or equal to 1 millimeter, in order to be able to consider that all the switches of the group change state virtually simultaneously.

So, depending on the length of the chain, several cells CELC are regularly interspersed between two switching cells CELM, for example every millimeter, thus regularly ensuring electrical couplings between the second propagation line L5 and the control line L3 for the transistors.

Furthermore, in order to recondition the control signal SC propagating over these lines L4 and L5, each coupling cell CELC advantageously comprises one or more buffer stages. These buffer stages are disposed in the first propagation line L4 and in the second propagation line L5.

In order to provide an electrical continuity between the propagation line L4 and the propagation line L5, the end cell CELX comprises a metallization MX connected to the arrival end of the propagation line L4 and to the departure end of the propagation line L5.

The control circuit CTRL comprises a controller MCM designed to deliver, here via a buffer stage BF, the control signal SC on the first propagation line L4. This control signal is in fact a logic signal which, in the example described, when it takes the logical value '0' (corresponding for example to a zero voltage), will make the PMOS transistors conduct. Conversely, when the logical signal is in the high state (voltage equal to a few volts for example) the transistors TR are turned off.

The controller MCM takes, for example, the form of a CMOS logic circuit with a conventional structure.

The control circuit CTRL also includes processing circuitry MTR coupled to the first end (arrival end) of the second propagation line L5. More precisely, this circuitry MTR will detect the arrival of the signal SC at the end of its return propagation.

The circuitry MTR is, in this example, also connected to the control line L3 for the transistors in such a manner as to determine its voltage level.

Lastly, the circuitry MTR is also here connected to the second power supply line L2 in order to also determine its voltage level.

The circuitry MTR is also configured for, when a delivery condition is satisfied, delivering the state signal VDDI_OK indicating that the power supply voltage VDDI is present on the second power supply line L2 and that the sector can accordingly start to execute its function.

The arrival of the signal SC at the first end of the chain CH1 may be determined by measuring the voltage on the propagation line L5 at this location. In this example, when the voltage on the line falls to zero, this is representative of the arrival of the signal SC.

The processing circuitry MTR will also compare the voltage level on the control line L3 with a first threshold VTH1 and compare the voltage level on the power supply line L2 with a second threshold VTH2.

For this purpose, the processing circuitry MTR comprises voltage detectors with a conventional structure. In one example, the circuitry can include differential pairs of transistors. Another possible exemplary embodiment is that described in U.S. Pat. No. 7,671,623.

The processing circuitry MTR also comprises logic circuitry, with a conventional structure. The logic circuitry allows the logical control signal VDDI_OK to be delivered when the delivery condition is met.

Figure 4:
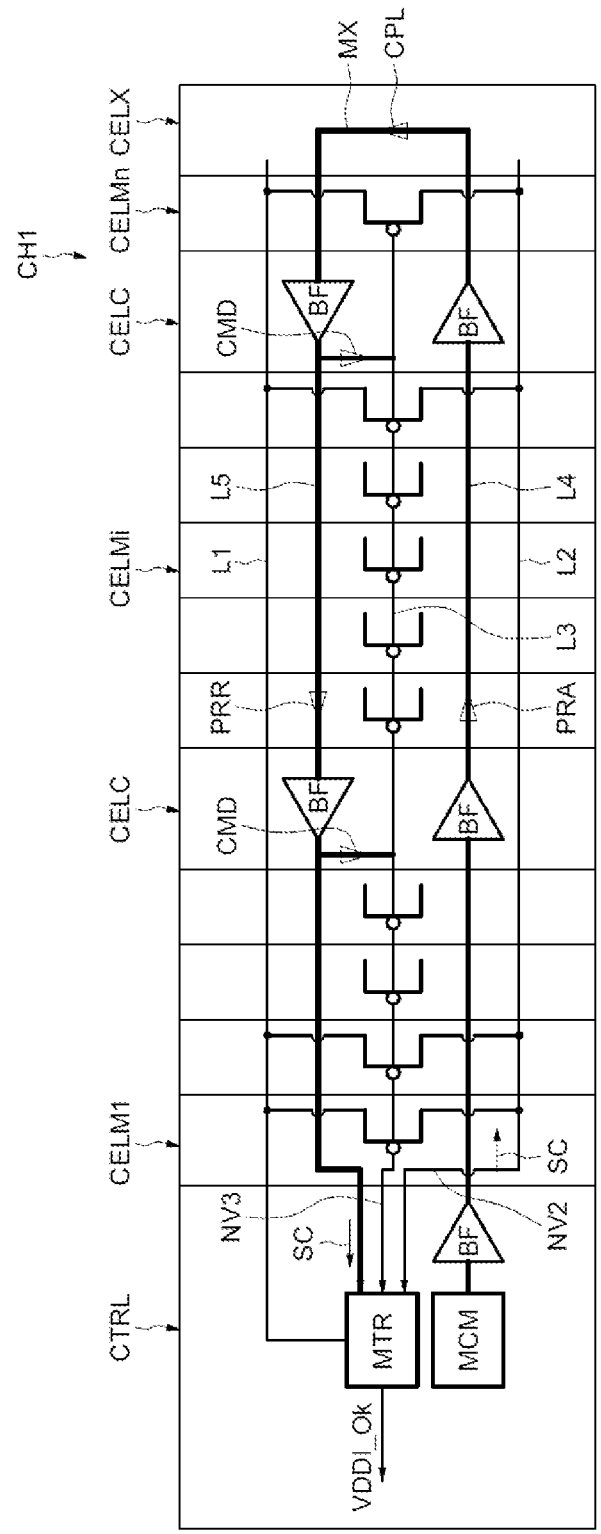

Reference is now more particularly made to FIG. 4 in order to illustrate the operation of this device.

The control signal SC is first of all propagated in the outbound direction (arrow PRA) from the first end of the chain towards its second end then, by virtue of the electrical coupling CPL between the outbound propagation line L4 and the return propagation line L5, propagated in the reverse direction from the second end of the chain towards the first end of the chain.

Furthermore, whereas during the first propagation PRA (outbound propagation) there is no control of the switches, during the propagation in the reverse direction PRR there is a control of the switches, in this example, starting from that situated at the second end of the chain.

The arrival of the control signal SC is detected by the processing circuitry MTR. This detected arrival is an indication that all the switches of the chain have been closed, and this is true independent of the length of this chain.

The detection of this arrival of the control signal SC at the end of its return propagation PRR alone could be sufficient for triggering the delivery of the state signal VDDI_OK.

Figure 5:
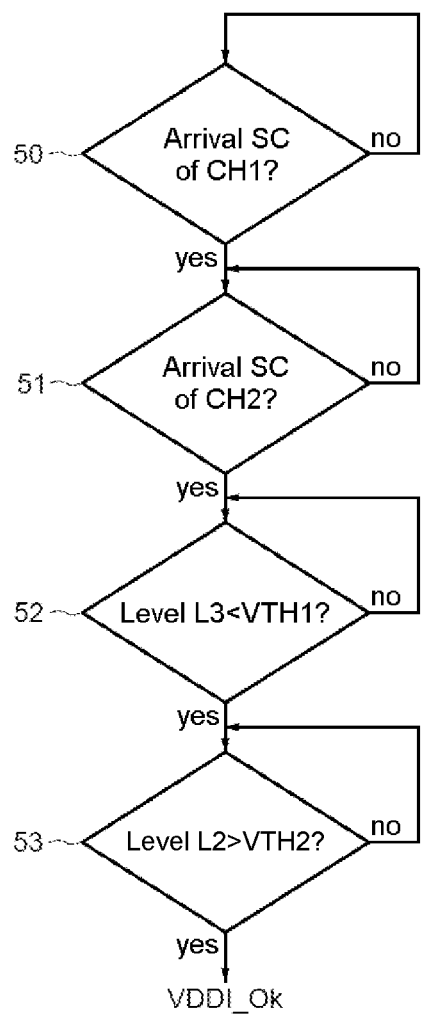

However, as illustrated in FIG. 5, it is preferable to combine this indication of arrival with other indications.

More precisely, in the step 50, the arrival of the control signal SC is detected coming from the chain CH1 at the end of its return propagation PRR.

In the case where this arrival is detected, and in the case where the device only comprises a single chain CH1, the sequence goes directly to the step 52 in which it is verified whether the level of the voltage on the line L3 is less than the first threshold VTH1 (since the transistors are PMOS transistors).

In the case where this threshold is exceeded, it is subsequently verified, in the step 53, whether the voltage level of the power supply line L2 is greater than the second threshold VTH2.

In the affirmative, the state signal VDDI_OK is delivered.

It goes without saying that the steps 52 and 53 could be switched around and that one of these two steps could potentially be removed.

In practice, as illustrated in FIG. 1, the control circuit CTRL can manage two chains of switches CH1 and CH2.

Figure 6:
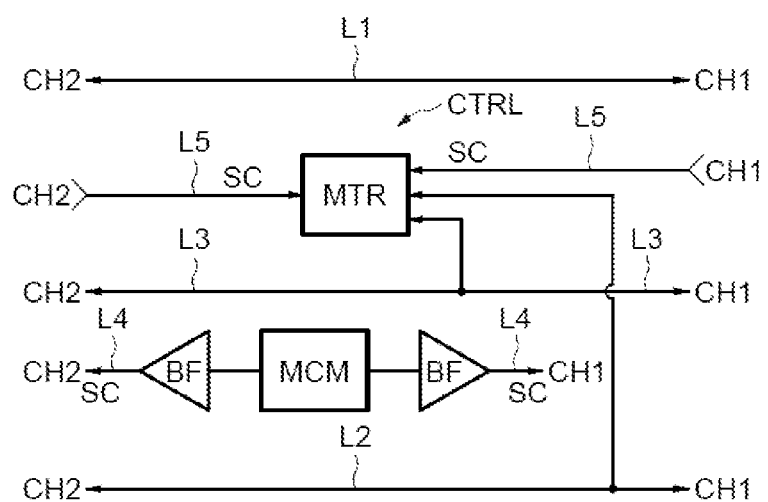

This is illustrated in more detail, but very schematically, in FIG. 6.

The structure of the second chain CH2 here is analogous to that of the first chain CH1 which has been previously described.

The control line L3 runs within the two chains CH1 and CH2.

The controller MCM delivers not only the signal SC on the first propagation line L4 of the chain CH1 but also on the first propagation line L4 of the second chain CH2.

On the return, the processing circuitry MTR detects not only the arrival of the control signal SC at the end of its return propagation along the first chain CH1 but also the arrival of the control signal SC at the end of its return propagation along the chain CH2, after having also controlled the switches of this chain CH2.

Furthermore, in this case, if r is eference is again made to FIG. 5, it can be seen that the delivery condition for the state signal VDDI_OK also comprises a detected arrival of the control signal SC coming from the second chain CH2 (step 51).

Figure 7:
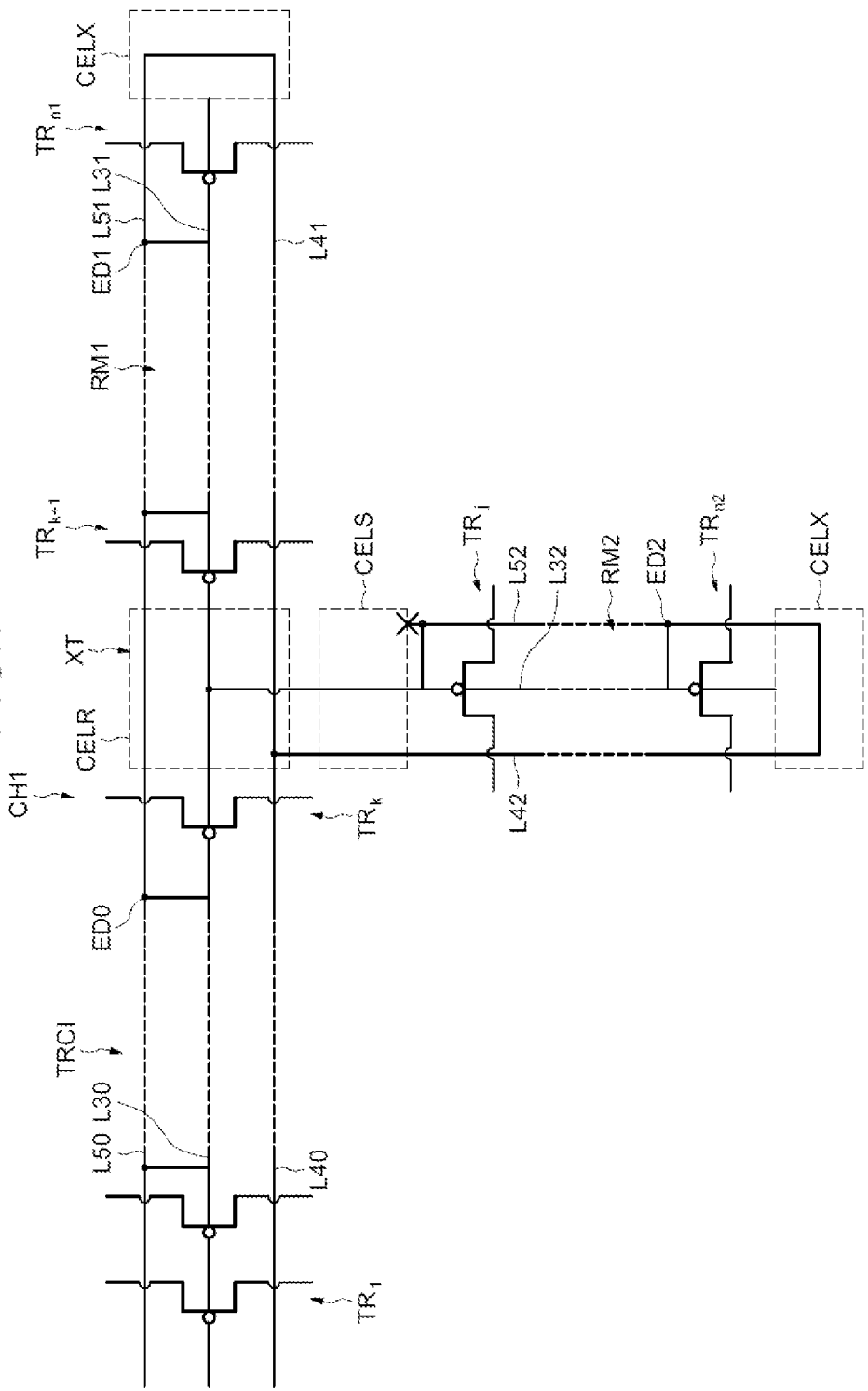

Reference is now more particularly made to FIG. 7 and the following figures, in order to illustrate embodiments and their implementation in which at least one of the chains connected to the control circuit CTRL is a branched chain. The use of such branched chains allows certain branches of this chain to penetrate into the sector if the geometry and the disposition of the blocks of this sector allow it.

In FIG. 7, it is the first chain CH1 which is branched.

More precisely, the chain CH1 here comprises an initial section TRCI of switches $TR_1$-$TR_k$ running from the first end of the chain, in other words that connected to the control circuit CTRL, and extended by several branches of switches, here two branches RM1 and RM2.

The first branch RM1 comprises the switches $TR_{k+1}$ to $TR_{n1}$ whereas the second branch RM2 comprises the switches $TR_j$ to $TR_{n2}$.

The initial section TRCI and the two branches RM1 and RM2 here define two paths connected at an intersection XT.

More precisely, the section TRCI and the branch RM1 define a first path, while the section TRCI and the branch RM2 define a second path.

In this example, the assumption is made that the first path (TRCI+RM1) is the longest path.

In FIG. 7, for the purposes of simplification, from amongst the various lines only the control line for the switches, together with the two propagation lines for the control signal SC, have been shown very schematically.

More precisely, the control line L3 here is a branched control line which comprises a portion L30 within the section TRCI, a portion L31 within the branch RM1 and a portion L32 within the branch RM2.

The first propagation line for the control signal SC (propagation in the outbound direction) is also a branched propagation line which comprises a portion L40 within the section TRCI, a portion L41 within the branch RM1 and a portion L42 within the branch RM2.

As regards the propagation of the control signal SC in the reverse direction, the longest path should be differentiated from the other paths.

As regards the longest path, which here is the path TRCI+RM1, the sections of lines L51 and L50 define a second propagation line which runs from the free end of the corresponding branch, in this case the branch RM1, towards the first end of the chain. This second propagation line is coupled to the branched control line at at least one location ED1 situated at or in the neighborhood of the free end of the branch RM1. In practice, this second propagation line is coupled at several locations (for example the location ED0) to the branched control line.

As regards the other paths, in other words the shorter paths, in this case the path TRCI+RM2, the section of line L52 defines an elementary propagation line which runs from the free end of the corresponding branch, in this case the branch RM2, as far as just before the intersection XT with the second propagation line L50, L51.

Here again, this elementary propagation line L52 is coupled to the control line branched L32 at at least one location ED2 situated in the neighborhood of the free end of the branch RM2.

Furthermore, an end cell CELX is disposed at each free end of branch in such a manner as to provide the electrical coupling between the first branched propagation line and the second propagation line and the elementary propagation line.

Furthermore, the connection between the section TRCI and the various branches RM1 and RM2 is provided at the intersection XT by a connection cell CELR, whose structure will be discussed in more detail herein below.

Furthermore, a switching cell CELS, whose structure will also be discussed in more detail hereinafter, is disposed just upstream (in the direction of a return propagation) of the connection cell CELR on the branch RM2 in such a manner, as will now be seen, as to interrupt the propagation of the signal SC over the section L52, with the purpose of avoiding a conflict with the return propagation of the control signal over the second propagation line, in other words that associated with the longest path.

Figure 8:
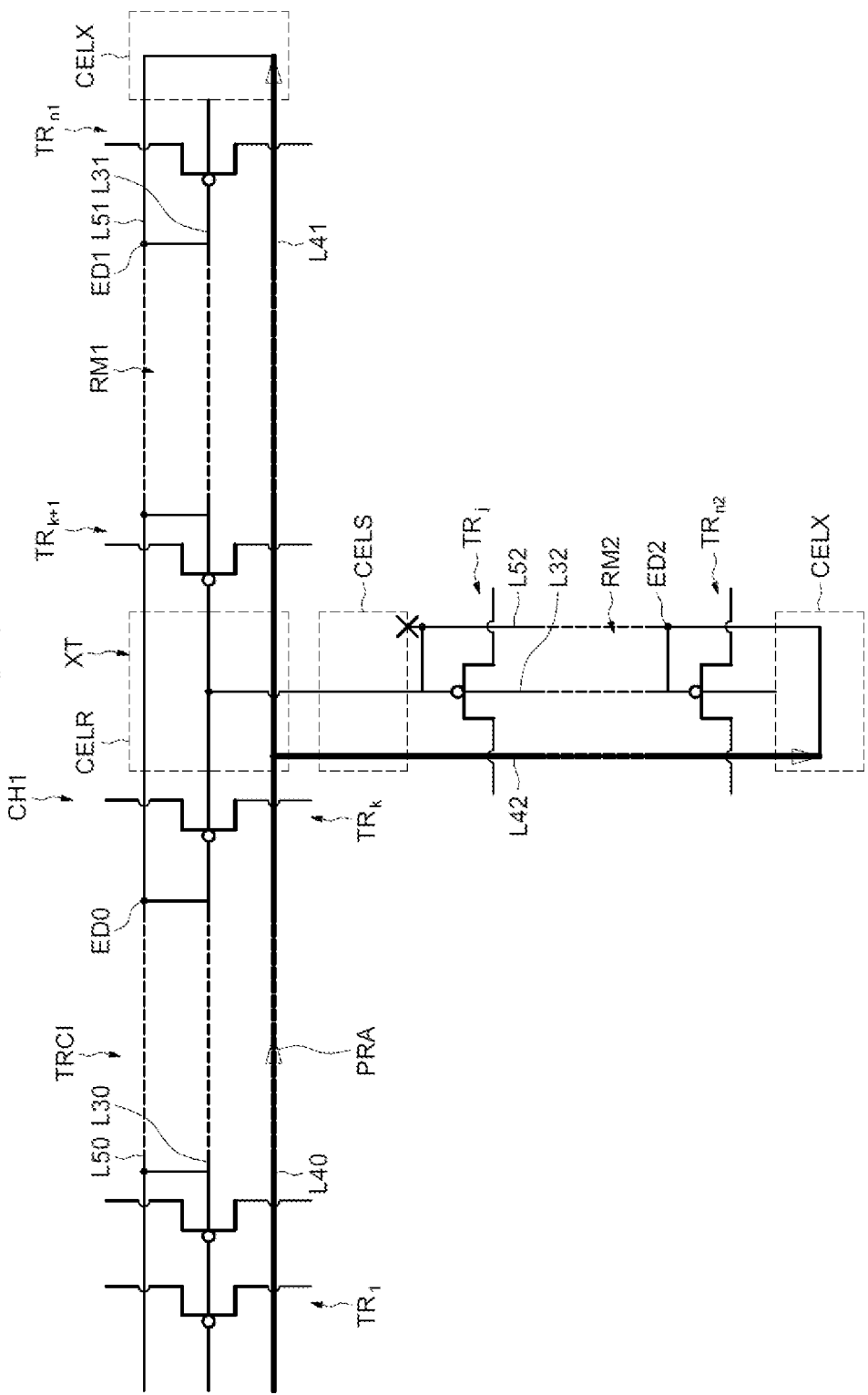
Figure 9:
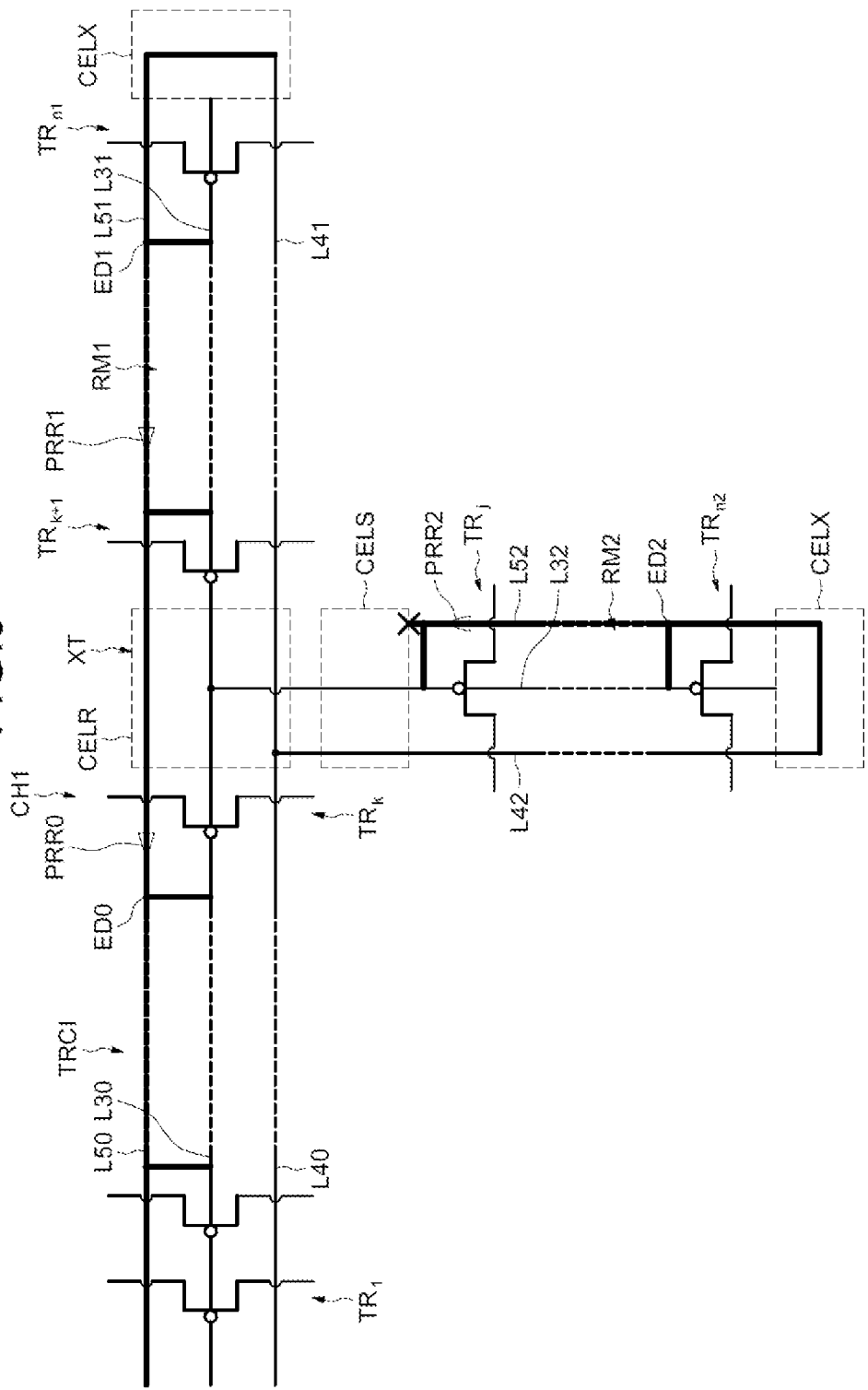

Reference is now more particularly made to FIGS. 8 and 9, in order to illustrate one embodiment of the method associated with the chain in FIG. 7.

The control signal SC is first of all propagated in the outbound direction (arrow PRA, FIG. 8) so as to reach the cells CELX of the branches RM1 and RM2, and this is without control of the switches.

Then, as illustrated in FIG. 9, the signal SC is propagated in return over the second propagation line L51, L50 (return propagation PRR1 over the section L51 followed by the propagation PRR0 over the section L50), after having passed through the end cell CELX. Furthermore, during this second propagation in the reverse direction, the control signal SC controls the various switches $TR_1$-$TR_k$, $TR_{k+1}$-$TR_{n1}$ starting, in this example, with the switch $TR_{n1}$ up to the switch $TR_1$.

As regards the shortest path, the control signal SC passes through the cell CELX situated at the end of the branch RM2 then propagates (arrow PRR2) in the reverse direction over the elementary propagation line L52 while controlling the switches $TR_j$-$TR_{n2}$, starting, in this example, with the switch $TR_{n2}$.

Furthermore, this propagation along the elementary propagation line L52 is interrupted in the switching cell CELS so as to avoid a conflict with the propagation of the control signal coming from the end of the branch RM1.

It can thus be seen that, by virtue of these return propagations, all the switches of the chain have been successively controlled and the arrival of the control signal is detected at the end of its reverse propagation coming from the longest path, which is then an indication that all the switches of all the branches have actually been controlled so as to become conducting.

Figure 10:
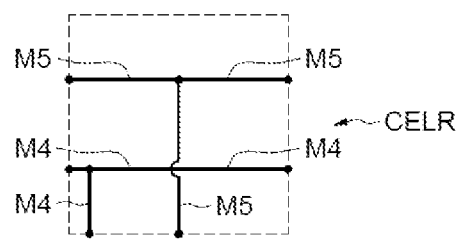

One exemplary embodiment of a connection cell CELR is illustrated schematically in FIG. 10.

Such a cell is a T-shaped cell, in other words all the metallizations inside the cell have the shape of a T. In FIG. 10, for the purposes of simplification, only the metallizations M4 and M5 which allow the outbound and return propagations of the control signal have been shown.

Figure 11:
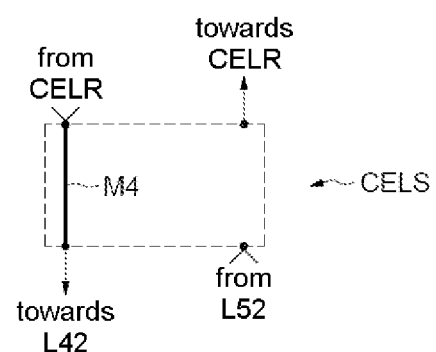

FIG. 11 illustrates very schematically one exemplary embodiment of a switching cell CELS. Here again, only the metallization M4 has essentially been shown which allows the outbound propagation of the control signal. On the other hand, the cell CELS lacks the metallization M5, which effectively allows the propagation of the control signal in the reverse direction to be interrupted.

Figure 12:
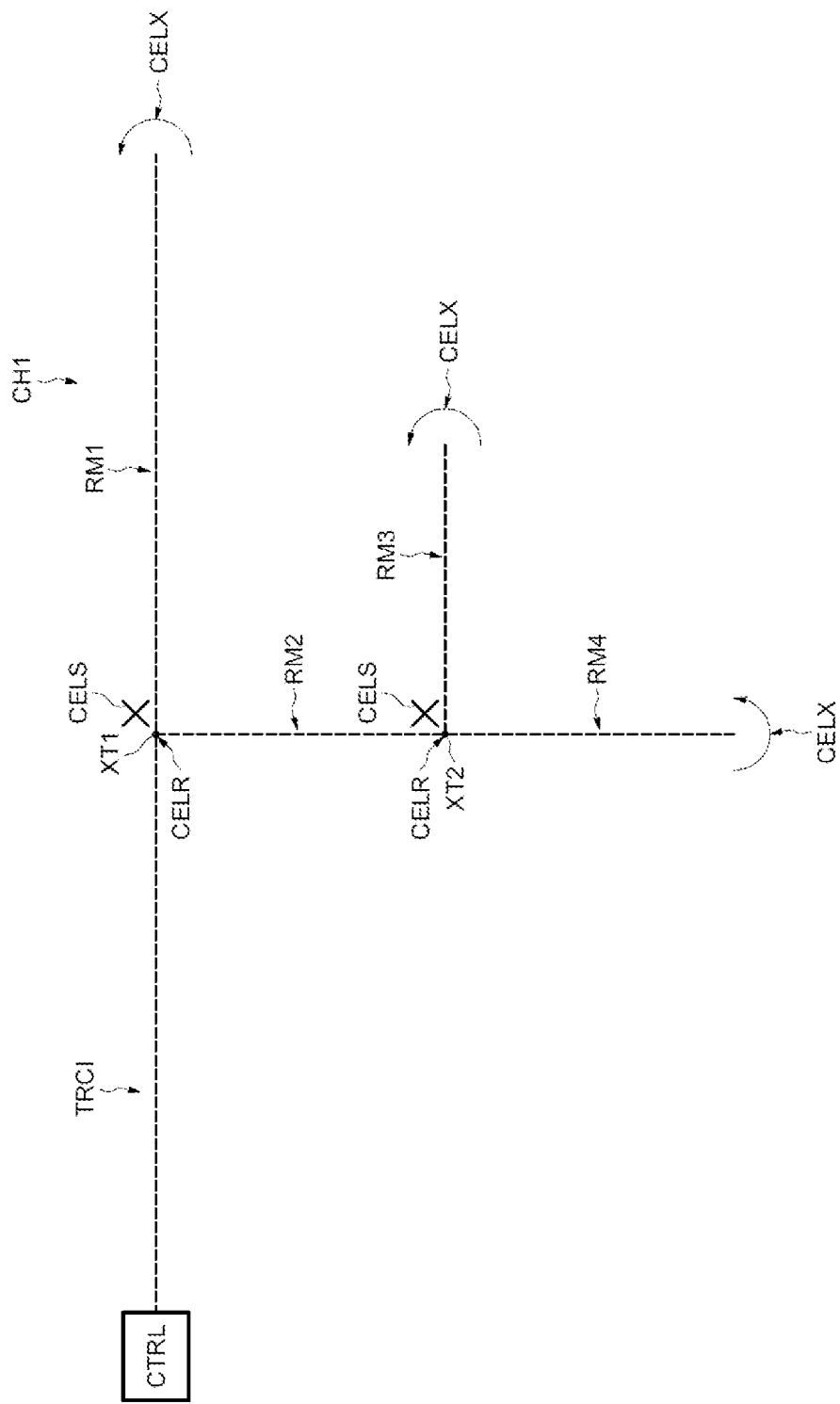

FIG. 12 illustrates very schematically another example of a complex branch of a switch chain CH1. In FIG. 12, for the purposes of simplification, only the various sections and branches have been shown by dashed lines without showing the propagation lines and the power supply lines. Furthermore, the interruption cells CELS have been shown schematically by a cross, whereas the end cells CELX have been shown by a curved arrow.

Here, the chain CH1 comprises an initial section TRCI extended by a first branch RM1 and by a second branch RM2. The second branch RM2 is itself extended by a third branch RM3 and by a fourth branch RM4. This assembly therefore defines a first path TRCI, RM2, RM4, a second path TRCI, RM1 and a third path TRCI, RM2, RM3.

In this example, it is assumed that the longest path is the path TRCI, RM2, RM4.

As a consequence, a switching cell CELS is disposed on the branch RM1 upstream of the connection cell CELR disposed at the intersection XT1 of the two branches RM1 and RM2.

Similarly, a switching cell CELS is disposed on the branch RM3 upstream of the connection cell CELR situated at the intersection XT2 between the branches RM3 and RM4.

Figure 13:
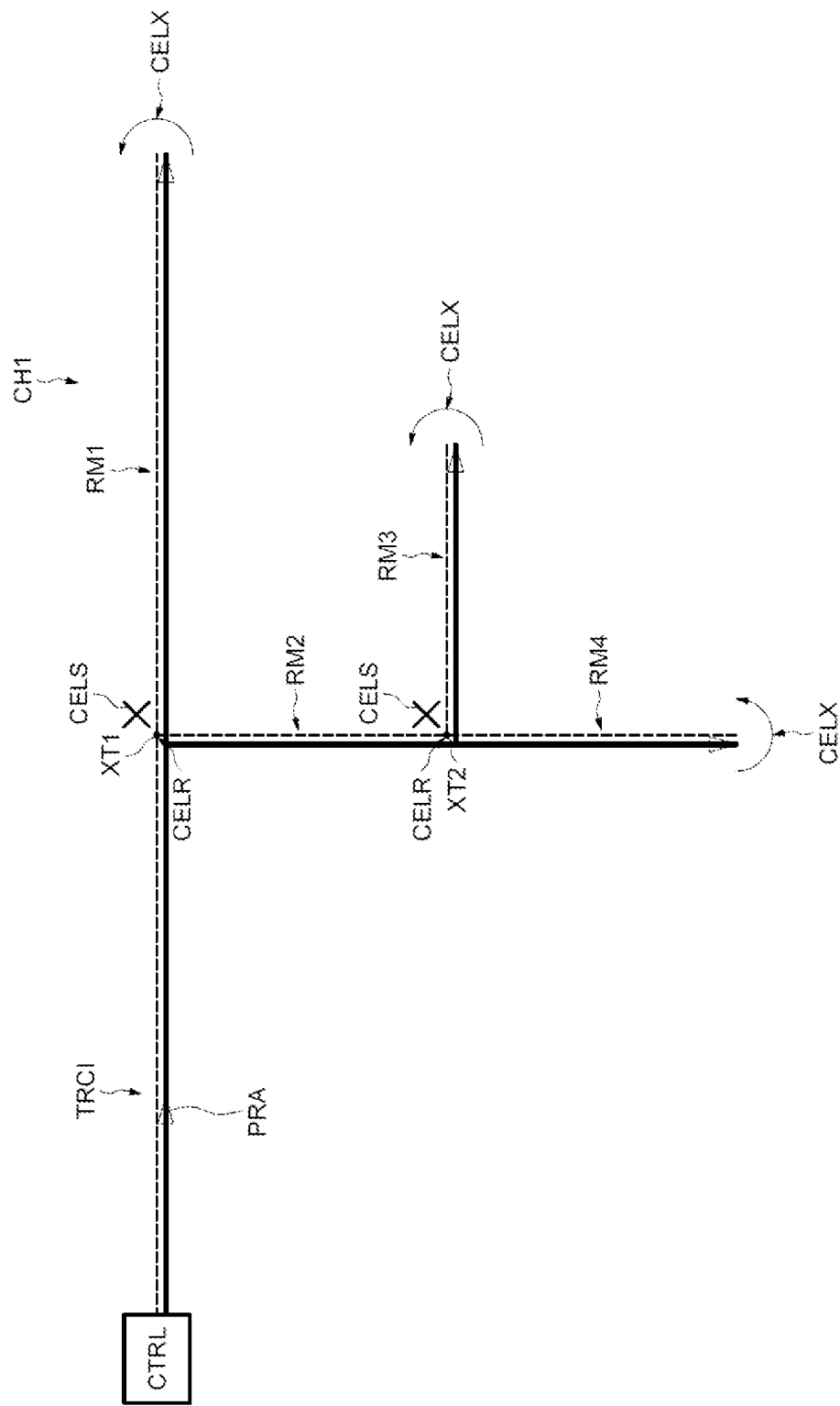

As illustrated in FIG. 13, the control signal is first of all propagated (arrow PRA) over the first branched propagation line until it reaches the end cells CELX respectively disposed at the free ends of the branches RM1, RM3 and RM4, in this case without control of the corresponding switches.

Figure 14:
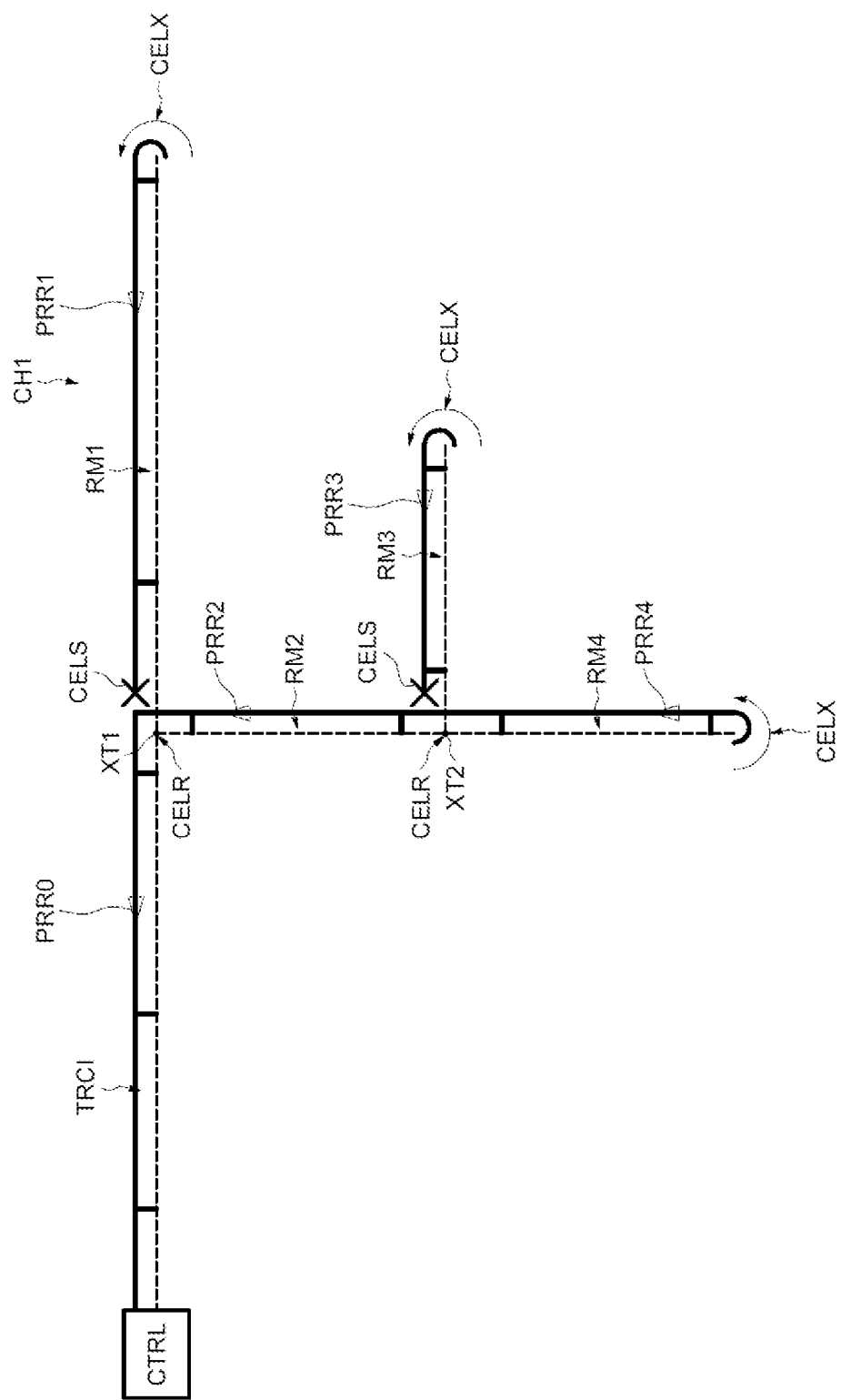

Then, as illustrated in FIG. 14, the control signal SC undergoes, over the longest path, a propagation in the reverse direction PRR4, PRR2 and PRR0 with control of the switches situated along the branches RM4, RM2 and the section TRCI.

Furthermore, the control signal also undergoes propagation in the reverse direction PRR3 over the branch RM3 with interruption in the cell CELS and control of the corresponding switches situated along this branch RM3.

Lastly, the control signal SC also undergoes a return propagation PRR1 along the branch RM1 with interruption in the cell CELS upstream of the intersection XT1, and with control of the switches situated along the branch RM1.

Thus, here again, all the switches of the chain have been successively controlled starting with those situated at the ends or in the neighborhood of the ends of the corresponding paths. On the other hand, only the arrival of the control signal coming from the longest path is detected.

Such a method and such a device thus allow the control circuit CTRL to be kept outside of the sector, while at the same time being able to have branches which penetrate into the sector and being able to deliver the state signal while being assured that all the switches have previously been controlled so as to become conducting.

The invention is not limited to the embodiments which have just been described but encompasses all of their variants.

Thus, what has just been described for a chain connected between a power supply line designed to be connected to a voltage VDDO, and another power supply line designed to be set at a potential VDDI, may be applied to a chain connected between a power supply line designed to be connected to the ground potential GNDO, and another power supply line designed to be set at the ground potential GNDI.

What is claimed is:

1. A method for management of an electrical power-up of at least one sector of an electronic circuit, the electrical power-up using a first chain of switches respectively coupled between a first power supply line coupled to a first voltage and a second power supply line coupled to the sector, the switches being controllable by a control signal so as to close the switches, the method comprising:
propagating the control signal in a forward direction from a first end of the first chain towards a second end of the first chain without controlling the switches;
then propagating the control signal in a reverse direction from the second end towards the first end, wherein the switches are controlled while propagating in the reverse direction starting from a switch located at the second end;
detecting arrival of the control signal at the first end of the first chain at the end after propagating the control signal in the reverse direction; and
delivering a state signal upon attaining a delivery condition, the delivery condition including detection of the arrival of the control signal.

2. The method according to claim 1, wherein
the first chain comprises an initial section of switches running from the first end of the chain and extended by a plurality of branches of switches, the initial section and the branches respectively defining a plurality of connected paths with at least one intersection;
propagating the control signal in the forward direction comprises propagating the control signal from the first end of the chain towards a free end of each branch; and
propagating the control signal in the reverse direction comprises:
for a longest path, propagating the control signal in the reverse direction from the free end of the corresponding branch towards the first end of the chain with control of the switches located on this longest path during the propagation in the reverse direction starting from a switch located at the free end of the branch; and
for each other path, propagating the control signal in the reverse direction over a portion of the path running from the free end of the corresponding branch up to an intersection with the longest path or with another path, with control of the switches located on the portion during the propagation in the reverse direction starting from a switch located at the free end of the corresponding branch, and interrupting the propagation in the reverse direction at the intersection.

3. The method according to claim 1, further comprising determining a level of the control signal at a control input of a switch located at the first end of the first chain and comparing the determined level with a first threshold, wherein the delivery condition further comprises the level exceeding the first threshold.

4. The method according to claim 1, further comprising determining a level of a signal present on the second power supply line and comparing the level of the signal present on the second power supply line with a second threshold, wherein the delivery condition further comprises the level of the signal present on the second power supply line exceeding the second threshold by the level.

5. The method according to claim 1, wherein the electrical power-up also uses a second chain of switches respectively coupled between the first power supply line and the second power supply line and controllable by the control signal, the first end of the second chain being connected to the first end of the first chain, the method further comprising:
propagating the control signal in the forward direction from the first end of the second chain towards a second end of the second chain without controlling the switches of the second chain;
propagating the control signal in the reverse direction from the second end of the second chain towards the first end of the second chain while controlling the switches of the second chain during the propagation in the reverse direction, the controlling starting from a switch located at the second end of the second chain; and
detecting arrival of the control signal at the first end of the second chain at the end of the propagation in the reverse direction, wherein the delivery condition further comprises the detected arrival of the control signal from the second chain.

6. The method according to claim 1, wherein the switches are controlled while propagating in the reverse direction starting from a first group of switches located at the second end.

7. A device for management of an electrical power-up of a sector of an electronic circuit, the device comprising
a first chain of switches, each switch coupled between a first power supply line intended to be coupled to a first voltage and a second power supply line intended to be coupled to the sector, the switches being controllable by a control signal;
first propagation circuitry configured to propagate the control signal in a forward direction from a first end of the first chain towards a second end of the first chain without controlling the switches;
second propagation circuitry configured to propagate the control signal in a reverse direction from the second end towards the first end while controlling the switches, the controlling starting from a first switch located at the second end; and
processing circuitry configured to detect arrival of the control signal at the first end of the first chain after the control signal has propagated in the reverse direction and to deliver a state signal upon attaining a delivery condition that comprises the detected arrival of the control signal.

8. The device according to claim 7, further comprising a control line coupled to respective control inputs of the switches;
wherein the first chain comprises a non-branched section;
wherein the first propagation circuitry comprises control circuitry configured to deliver the control signal and coupled to a departure end of a first propagation line extending from the first end of the chain to the second end of the chain without electrical coupling with the control line,
wherein the second propagation circuitry comprises a second propagation line extending from the second end of the chain to the first end of the chain and coupled to the control line at a location located near the second end of the chain, the second propagation circuitry also comprising and electrical coupling circuitry connecting an arrival end of the first propagation line to the departure end of the second propagation line; and
wherein the processing circuitry is coupled to the arrival end of the second propagation line.

9. The device according to claim 8, wherein each switch of the first chain is incorporated into a switching cell;
wherein the switching cell comprises a first metallization and a second metallization between which the switch is coupled, a third metallization coupled to the control input of the switch, a fourth metallization and a fifth metallization;
wherein the first metallizations of the switching cells are electrically coupled so as to form the first power supply line;
wherein the second metallizations of the cells are electrically coupled so as to form the second power supply line;
wherein the third metallizations of the cells are electrically coupled so as to form the control line for the switches;
wherein the fourth metallizations of the cells are electrically coupled so as to form the first propagation line;
wherein the control circuitry is coupled to the fourth metallization of the switching cell of the first chain; and
wherein the processing circuitry is coupled to the fifth metallization of the switching cell of the first chain.

10. The device according to claim 9, wherein
the fifth metallizations of the switching cells are electrically coupled so as to form the second propagation line;

the second propagation circuitry further comprises a coupling cell located between two switching cells in a neighborhood of the second end of the first chain and configured for electrically coupling the second propagation line to the control line; and end electrical coupling circuitry comprises an end cell disposed at the second end of the first chain and comprising a metallization electrically coupled to the first and second propagation lines.

11. The device according to claim 7, wherein the first chain comprises an initial section of switches extending from the first end of the chain and extended by several branches of switches, the initial section and the branches respectively defining a plurality paths connected at at least one intersection.

12. The device according to claim 11, wherein:
the first propagation circuitry is configured to propagate the control signal from the first end of the chain towards a free end of each branch without controlling the switches; and
the second propagation circuitry is configured to:
with regards to a longest path, propagate the control signal in the reverse direction from the free end of the corresponding branch towards the first end of the chain while controlling the switches located on the longest path during the propagation in the reverse direction, the controlling starting from a switch located at the free end of the branch; and
with regards to each other paths, propagating the control signal in the reverse direction over a portion of the path running from the free end of the corresponding branch up to the intersection with the longest path or with another path, with control of the switches situated on the portion during the propagation in the reverse direction starting from a switch located at the free end of the corresponding branch and interrupting the propagation in the reverse direction at the intersection.

13. The device according to claim 12, further comprising a branched control line coupled to respective control inputs of the switches;
wherein the first propagation circuitry comprises control circuitry configured to deliver the control signal and coupled to a departure end of a first branched propagation line extending from the first end of the chain towards the free end of each branch without electrical coupling with the branched control line,
wherein the second propagation circuitry comprises
with regards to the longest path, a second propagation line extending from the free end of the corresponding branch towards the first end of the chain, and coupled to the branched control line at a location located near the end of the branch and end electrical coupling circuitry connecting the corresponding arrival end of the first branched propagation line to the departure end of the second propagation line; and
with regards to each other paths, an elementary propagation line extending from the free end of the corresponding branch up to before the intersection with the second propagation line or with another elementary propagation line, and coupled to the control line branched at a location near the end of the corresponding branch, and electrical coupling circuitry connecting the corresponding arrival end of the first branched propagation line to the departure end of the corresponding elementary propagation line; and wherein the processing circuitry is coupled to an arrival end of the second propagation line.

14. The device according to claim 13, wherein each switch of the first chain is incorporated into a switching cell;
wherein the switching cell comprises a first metallization and a second metallization between which the switch is coupled, a third metallization coupled to the control input of the switch, a fourth metallization and a fifth metallization;
wherein the first metallizations of the switching cells are electrically coupled so as to form the first power supply line;
wherein the second metallizations of the cells are electrically coupled so as to form the second power supply line;
wherein the third metallizations of the cells are electrically coupled so as to form the control line;
wherein the fourth metallizations of the cells are electrically coupled so as to form the first propagation line;
wherein the control circuitry is coupled to the fourth metallization of a first switching cell of the first chain; and
wherein the processing circuitry is coupled to the fifth metallization of the first switching cell of the first chain.

15. The device according to claim 14, wherein
the fifth metallizations of the switching cells are electrically coupled so as to form the second propagation line;
the second propagation circuitry further comprises a coupling cell located between two switching cells in a neighborhood of the second end of the first chain and configured for electrically coupling the second propagation line to the control line; and
end electrical coupling circuitry comprises an end cell disposed at the second end of the first chain and comprising a metallization electrically coupled to the first and second propagation lines.

16. The device according to claim 7, wherein the processing circuitry is further configured to determine a level of the signal present at a control input of a switch situated at the first end of the first chain and to compare this level with a first threshold, wherein the delivery condition further comprises the level exceeding the first threshold.

17. The device according to claim 7, wherein the processing circuitry is further configured to determine a level of the signal present on the second power supply line and to compare this level with a second threshold, the delivery condition further comprising the level exceeding of the second threshold.

18. The device according to claim 7, further comprising a second chain of switches, each switch respectively coupled between the first power supply line and the second power supply line and controllable by the control signal, the first end of the second chain being connected to the first end of the first chain.

19. The device according to claim 18, wherein
the first propagation circuitry is further configured to also propagate the control signal in the forward direction from the first end of the second chain towards a second end of the second chain without control of the switches of the second chain during the propagation in the forward direction;
the second propagation circuitry is configured to also propagate the control signal in the reverse direction from the second end of the second chain towards the first end of the second chain with control of the switches of the second chain during the propagation in the reverse direction starting from a switch located at the second end of the second chain; and the processing circuitry is further configured to detect arrival of the control signal at the first end of the second chain at the end of its propagation in the reverse direction, wherein the delivery condition further comprises the detected arrival of the control signal coming from the second chain.

20. A device for management of an electrical power-up of a sector of an electronic circuit, the device comprising a first chain of switches coupled between a first power supply line intended to be coupled to a first voltage and a second power supply line intended to be coupled to the sector, the switches being controllable by a control signal;

first propagation means for propagating the control signal in a forward direction from a first end of the first chain towards a second end of the first chain without controlling the switches during the propagation in the forward direction;

second propagation means for propagating the control signal in a reverse direction from the second end towards the first end while controlling the switches during the second propagation in the reverse direction, the controlling starting from a group of at least one switch situated at the second end; and processing means for detecting arrival of the control signal at the first end of the first chain at the end of the second propagation, and for delivering a state signal after attaining a delivery condition comprising the detected arrival of the control signal.

21. The device according to claim 20, further comprising a control line coupled to respective control inputs of the switches;

wherein the first chain a non-branched section, wherein the first propagation means comprise control means for delivering the control signal and coupled to a departure end of a first propagation line extending from a first end of the chain to the second end of the chain without electrical coupling with the control line, wherein the second propagation means comprises:
a second propagation line extending from the second end of the chain to the first end of the chain, coupled to the control line at at least one location located near the second end of the chain; and means for end electrical coupling connecting an arrival end of the first propagation line to the departure end of the second propagation line; and wherein the processing means is coupled to an arrival end of the second propagation line.

22. The device according to claim 20, wherein the first chain comprises an initial section of switches running from the first end of the chain and extended by several branches of switches, the initial section and the branches respectively defining a plurality of paths connected at at least one intersection;

wherein the first propagation means is configured for propagating the control signal from the first end of the chain towards a free end of each branch without controlling the switches during this first propagation; and wherein the second propagation means comprises means for for a longest path, propagating the control signal in the reverse direction from the free end of the corresponding branch towards the first end of the chain with a control of the switches situated on this longest path during the propagation in the reverse direction, starting from a group of at least one switch situated at the free end of the branch, and for each other path, propagating the control signal in the reverse direction over a portion of the path running from the free end of the corresponding branch up to the intersection with the longest path or with another path, with control of the switches situated on the portion during the propagation in the reverse direction starting from a group of at least one switch situated at the free end of the corresponding branch, and interruption of the propagation in the reverse direction at the intersection.

23. The device according to claim 22, further comprising a branched control line coupled to respective control inputs of the switches;

wherein the first propagation means comprise control means for delivering the control signal and coupled to a departure end of a first branched propagation line running from a first end of the chain towards the free end of each branch without electrical coupling with the branched control line, wherein the second propagation means comprises
for the longest path, a second propagation line extending from the free end of the corresponding branch towards the first end of the chain, and coupled to the branched control line at a location situated near the end of the branch, and means for end electrical coupling connecting the corresponding arrival end of the first branched propagation line to the departure end of the second propagation line; and for each other path, an elementary propagation line extending from the free end of the corresponding branch up to before the intersection with the second propagation line or with another elementary propagation line, and coupled to the control line branched at at least one location situated at or in the neighborhood of the end of the corresponding branch, and means for end electrical coupling connecting the corresponding arrival end of the first branched propagation line to the departure end of the corresponding elementary propagation line, wherein the processing means is coupled to the arrival end of the second propagation line.

24. The device according to claim 21, wherein each switch of the first chain is incorporated into a switching cell;

wherein the switching cell comprises a first metallization and a second metallization between which the switch is connected, a third metallization connected to the control input of the switch, a fourth metallization and a fifth metallization;

wherein the first metallizations of the switching cells are electrically coupled so as to form the first power supply line;

wherein the second metallizations of the cells are electrically coupled so as to form the second power supply line;

wherein the third metallizations of the cells are electrically coupled so as to form the control line;

wherein the fourth metallizations of the cells are electrically coupled so as to form the first propagation line;

wherein the control means is coupled to the fourth metallization of the first switching cell of the first chain; and wherein the processing means is coupled to the fifth metallization of the first switching cell of the first chain.

25. The device according to claim 21, wherein the fifth metallization of the switching cells are electrically coupled so as to form the second propagation line;

the second propagation means further comprises at least one coupling cell inserted between two switching cells in the neighborhood of the second end of the first chain and configured for electrically coupling the second propagation line to the control line; and the means for end electrical coupling comprises an end cell disposed at the second end of the first chain and comprising a metallization electrically coupled to the first and second propagation lines.

26. The device according to claim 20, wherein the processing means further comprises means for determining the level of the signal present at a control input of the switch situated at the first end of the first chain and for comparing this level with a first threshold, and the delivery condition further comprises the level exceeding of the first threshold.

27. The device according to claim 20, wherein the processing means further comprise means for determining the level of the signal present on the second power supply line and for comparing this level with a second threshold, the delivery condition furthermore comprises the level exceeding of the second threshold.

* * * * *